(12) United States Patent
Komiyama et al.

(10) Patent No.: US 12,410,058 B2
(45) Date of Patent: Sep. 9, 2025

(54) METHOD FOR MANUFACTURING CARBON NANOTUBE AQUEOUS DISPERSION

(71) Applicant: HOKUETSU CORPORATION, Nagaoka (JP)

(72) Inventors: Hideaki Komiyama, Nagaoka (JP); Atsushi Tamura, Nagaoka (JP); Toshihiko Soyama, Nagaoka (JP)

(73) Assignee: HOKUETSU CORPORATION, Nagaoka (JP)

( * ) Notice: Subject to any disclaimer, the term of this patent is extended or adjusted under 35 U.S.C. 154(b) by 847 days.

(21) Appl. No.: 17/761,522

(22) PCT Filed: Sep. 14, 2020

(86) PCT No.: PCT/JP2020/034637
§ 371 (c)(1),
(2) Date: Mar. 17, 2022

(87) PCT Pub. No.: WO2021/065432
PCT Pub. Date: Apr. 8, 2021

(65) Prior Publication Data
US 2022/0363544 A1  Nov. 17, 2022

(30) Foreign Application Priority Data
Oct. 2, 2019 (JP) .................................. 2019-182391

(51) Int. Cl.
*C01B 32/174* (2017.01)
*C08J 3/215* (2006.01)
*C08K 3/04* (2006.01)
*C08L 1/02* (2006.01)
*H05K 9/00* (2006.01)

(52) U.S. Cl.
CPC ............. *C01B 32/174* (2017.08); *C08J 3/215* (2013.01); *C08K 3/041* (2017.05); *C08L 1/02* (2013.01); *C08K 2201/011* (2013.01); *H05K 9/009* (2013.01)

(58) Field of Classification Search
None
See application file for complete search history.

(56) References Cited

U.S. PATENT DOCUMENTS

| | | | | |
|---|---|---|---|---|
| 2006/0052509 A1* | 3/2006 | Saitoh | ..................... | C08K 3/041 524/495 |
| 2013/0200310 A1* | 8/2013 | Rudhardt | ............... | B82Y 40/00 252/502 |
| 2014/0291589 A1 | 10/2014 | Hata et al. | | |
| 2015/0368108 A1 | 12/2015 | Sone | | |
| 2016/0020466 A1* | 1/2016 | Ulbrich | ................. | H01M 4/587 252/511 |
| 2016/0152843 A1 | 6/2016 | Hwang et al. | | |
| 2017/0283625 A1 | 10/2017 | Hwang et al. | | |
| 2018/0002179 A1 | 1/2018 | Okamoto et al. | | |
| 2020/0002172 A1 | 1/2020 | Shigeta | | |

FOREIGN PATENT DOCUMENTS

| | | |
|---|---|---|
| CN | 103764556 A | 4/2014 |
| CN | 104936895 A | 9/2015 |
| CN | 205187874 U | 4/2016 |
| CN | 105647086 A | 6/2016 |
| CN | 205731115 U | 11/2016 |
| CN | 107317034 A | 11/2017 |
| CN | 107556527 A | 1/2018 |
| EP | 4132248 A1 | 2/2023 |
| JP | 2013-082610 A | 5/2013 |
| JP | 2013-175322 A | 9/2013 |
| JP | 2013-230951 A | 11/2013 |
| JP | 2015-188853 A | 11/2015 |
| JP | 2016-084423 A | 5/2016 |
| KR | 10-2010-0049754 A | 5/2010 |
| KR | 10-2017-0122201 A | 11/2017 |
| WO | 2018/180350 A1 | 10/2018 |
| WO | 2020/194380 A1 | 10/2020 |
| WO | 2020/195974 A1 | 10/2020 |

OTHER PUBLICATIONS

Feb. 5, 2024 Office Action issued in Chinese Patent Application No. 202080069737.2.
Jul. 17, 2023 Office Action issued in Chinese Patent Application No. 202080069737.2.
Oct. 4, 2023 Extended European Search Report Issued in European Patent Application No. 20871132.5.
Liu et al., Aggregation and stabilization of multiwalled carbon nanotubes in aqueous suspensions: influences of carboxymethyl cellulose, starch and humic acid, RSC Advances, 2016, vol. 6 No. 71.
Nov. 20, 2024 Office Action isssued in Korean Patent Application No. 10-2022-7012810.
Mar. 28, 2024 Office Action issued in Korean Patent Application No. 10-2022-7012810.
Dec. 6, 2022 Office Action issued in Japanese Patent Application No. 2021-550546.
Kobayashi, Yoshinori, "Fine Particle Dispersion Techniques Resulting from Differences in Wet-Type Dispersion Devices," Polyfile, Feb. 2010, vol. 47, No. 552, pp. 16-23.
Nov. 24, 2020 International Search Report issued in International Patent Application No. PCT/JP2020/034637.

* cited by examiner

*Primary Examiner* — Tanisha Diggs
(74) *Attorney, Agent, or Firm* — Oliff PLC

(57) ABSTRACT

A method of producing a carbon nanotube aqueous dispersion having satisfactory dispersibility. The method of producing a carbon nanotube aqueous dispersion includes: preparing mixed liquids by mixing carbon nanotubes, carboxymethyl cellulose and water; and dispersing the carbon nanotubes contained in the mixed liquids by an aqueous counter collision method, wherein a ratio of a mass of the carboxymethyl cellulose to a mass of the carbon nanotubes in the mixed liquids is 1/7 or more.

6 Claims, 13 Drawing Sheets

```
┌─────────────────────────────────────┐
│  MIXED LIQUID PREPARATION STEP OF   │──S1
│       PREPARING MIXED LIQUID        │
└─────────────────────────────────────┘
                   │
                   ▼
┌─────────────────────────────────────┐
│  CNT DISPERSION STEP OF DISPERSING CNT │──S2
└─────────────────────────────────────┘
```

FIG. 1

| DISPERSION No. | CNT : CMC | AQUEOUS COUNTER COLLISION METHOD | DISPERSIBILITY |
|---|---|---|---|
| 1 | 1:9 | PERFORMED | A |
| 2 | 1:6 | PERFORMED | A |
| 3 | 1:3 | PERFORMED | A |
| 4 | 1:1 | PERFORMED | A |
| 5 | 3:1 | PERFORMED | A |
| 6 | 5:1 | PERFORMED | A |
| 7 | 6:1 | PERFORMED | A |
| 8 | 7:1 | PERFORMED | B |
| 9 | 8:1 | PERFORMED | C |
| 10 | 9:1 | PERFORMED | C |
| 11 | NO CMC CONTAINED | PERFORMED | C |
| 12 | 1:1 | NOT PERFORMED | C |

FIG. 2

| DISPERSION No. | CNT:CMC | CNT CONTENT [MASS%] | THICKNESS [μm] | | S21 [dB] @300MHz | | S21 [dB] @7GHz | |
|---|---|---|---|---|---|---|---|---|
| | | | COATED PAPER | DRY FILM | COATED PAPER | DRY FILM | COATED PAPER | DRY FILM |
| 1 | 1:9 | 10.0 | 3.5 | 120 | -0.20 | -0.86 | -0.97 | -8.3 |
| 2 | 1:6 | 14.3 | 3.9 | 135 | -0.51 | -4.4 | -1.6 | -13.1 |
| 3 | 1:3 | 25.0 | 3.3 | 150 | -5.0 | -20.9 | -5.4 | -21.3 |
| 4 | 1:1 | 50.0 | 3.6 | 119 | -16.8 | -42.9 | -16.7 | -43.7 |
| 5 | 3:1 | 75.0 | 3.6 | 129 | -16.1 | -44.2 | -15.9 | -45.7 |
| 6 | 5:1 | 83.3 | 3.5 | 116 | -16.9 | -42.1 | -16.5 | -44.7 |
| 7 | 6:1 | 85.7 | 3.7 | 125 | -15.7 | -45.2 | -16.4 | -41.4 |
| 8 | 7:1 | 87.5 | 3.4 | 90 | -15.2 | - | -15.4 | -41.7 |
| 9 | 8:1 | 88.9 | 3.7 | - | -14 | - | -14.3 | - |
| 10 | 9:1 | 90.0 | 2.7 | - | -12.3 | - | -12.6 | - |

FIG. 4

| WET PULVERIZATION AND DISPERSION DEVICE | | THICKNESS [μm] | S21 [dB] | |
|---|---|---|---|---|
| TREATMENT TIME [min] | NUMBER OF PASSES | | @300MHz | @7GHz |
| UNTREATED | | 4.62 | −10.9 | −10.8 |
| 0.5 | 1 | 3.92 | −18.4 | −15.5 |
| 1 | 2 | 3.03 | −17.1 | −15.9 |
| 3 | 6 | 3.03 | −17.2 | −16.3 |
| 5 | 10 | 2.82 | −17.3 | −16.6 |
| 10 | 20 | 3.06 | −17.1 | −16.8 |
| 20 | 40 | 3.04 | −17.2 | −16.5 |

METHOD FOR MANUFACTURING CARBON NANOTUBE AQUEOUS DISPERSION

TECHNICAL FIELD

The present invention relates to a method of producing a carbon nanotube aqueous dispersion.

BACKGROUND ART

A carbon nanotube has a structure in which uniform flat graphite is wound into a tubular shape. Both ends of the carbon nanotube are each closed with a fullerene hemispherical structure and each inevitably have six 5-membered rings. Because of such unique structure, the carbon nanotube has various characteristics and is expected to be applied in a wide range of fields.

The carbon nanotubes have the property of being aggregated with each other, and hence it is difficult to disperse the carbon nanotubes in water with satisfactory uniformity. For example, in Patent Literature 1, there is a description that the carbon nanotubes are dispersed with a disperser, such as an ultrasonic homogenizer, by using a polysaccharide formed of carboxymethyl cellulose or the like and an anionic surfactant as dispersants.

CITATION LIST

Patent Literature

PTL 1: JP 2013-82610

SUMMARY OF INVENTION

Technical Problem

One of the objects according to some aspects of the invention is to provide a method of producing a carbon nanotube aqueous dispersion having satisfactory dispersibility.

Solution to Problem

According to one aspect of the invention, there is provided a method of producing a carbon nanotube aqueous dispersion, including:
  preparing mixed liquids by mixing carbon nanotubes, sodium carboxymethyl cellulose and water; and
  dispersing the carbon nanotubes contained in the mixed liquids by an aqueous counter collision method,
  a ratio of a mass of the sodium carboxymethyl cellulose to a mass of the carbon nanotubes in the mixed liquids being 1/7 or more.

In the above aspect of the method of producing a carbon nanotube aqueous dispersion, the ratio may be 1/6 or more.

In any of the above aspects of the method of producing a carbon nanotube aqueous dispersion, the ratio may be 9 or less.

In any of the above aspects of the method of producing a carbon nanotube aqueous dispersion, the aqueous counter collision method may include ejecting the mixed liquids from nozzle holes each having a diameter of 50 μm or more and 200 μm or less at a pressure of 150 MPa or more and 250 MPa or less to cause the mixed liquids to collide with each other.

In any of the above aspects of the method of producing a carbon nanotube aqueous dispersion, the aqueous counter collision method may be performed by using a wet pulverization and dispersion device.

In any of the above aspects of the method of producing a carbon nanotube aqueous dispersion, the number of passes of the mixed liquids in the wet pulverization and dispersion device may be 2 times or more and 10 times or less.

In any of the above aspects of the method of producing a carbon nanotube aqueous dispersion, the step of preparing the mixed liquids may include preparing the mixed liquids by further mixing a thickener.

In any of the above aspects of the method of producing a carbon nanotube aqueous dispersion, the step of preparing the mixed liquids may include using only the sodium carboxymethyl cellulose as a dispersant.

Advantageous Effects of Invention

According to the method of producing a carbon nanotube aqueous dispersion according to the invention, the carbon nanotube aqueous dispersion having satisfactory dispersibility of carbon nanotubes can be produced. In addition, by using the carbon nanotube aqueous dispersion obtained by the production method according to the invention, an electromagnetic wave shielding sheet having a high shielding property against an electromagnetic wave can be produced.

BRIEF DESCRIPTION OF DRAWINGS

FIG. 1 is a flowchart illustrating a method of producing a carbon nanotube aqueous dispersion according to an embodiment of the invention.

FIG. 2 is a table illustrating evaluation results of dispersibility of carbon nanotube aqueous dispersions 1 to 12.

FIG. 4 is a table illustrating evaluation results of an electromagnetic wave shielding property when a ratio between carbon nanotubes and sodium carboxymethyl cellulose is changed.

DESCRIPTION OF EMBODIMENTS

Figure 3:
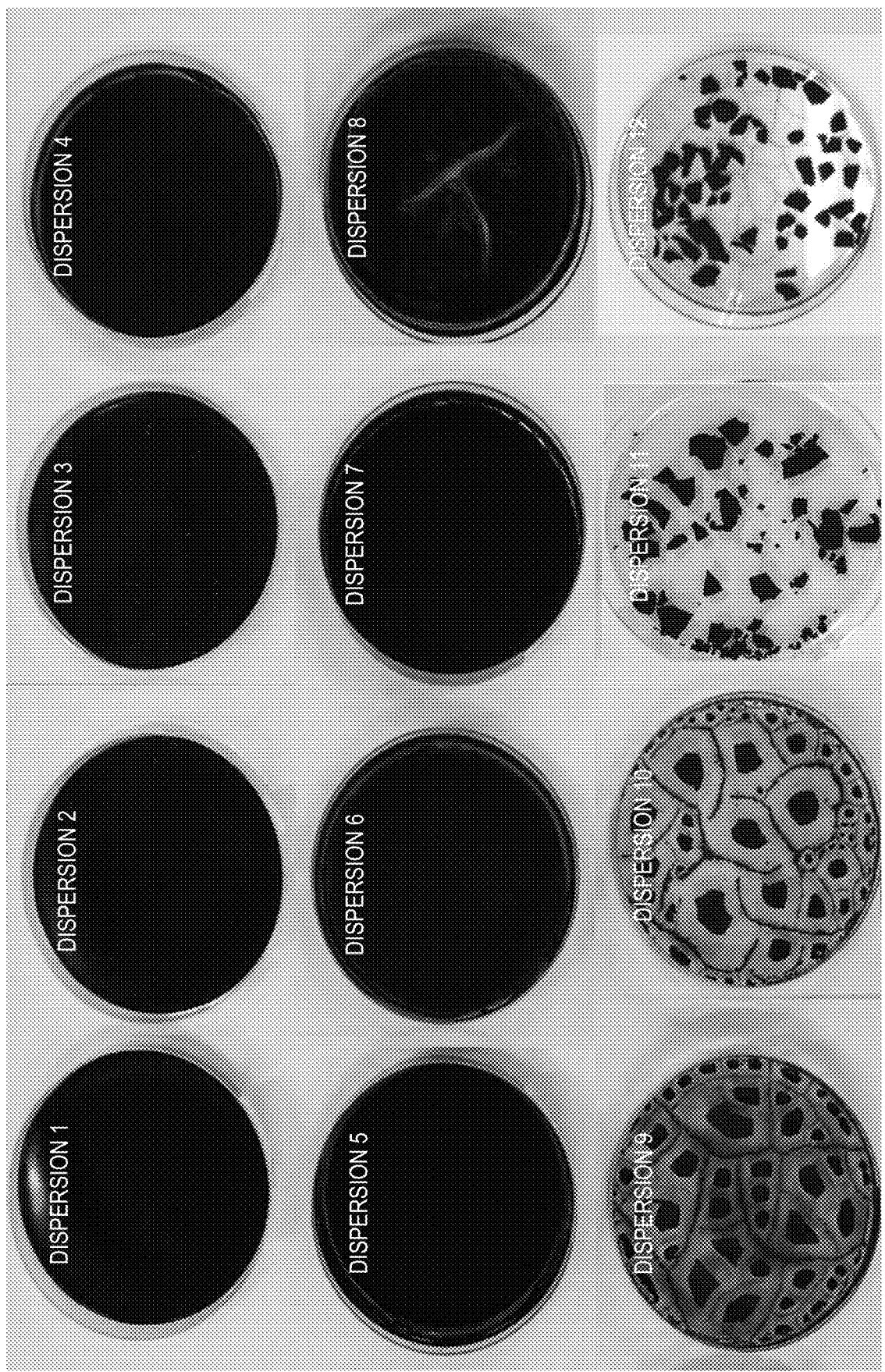
FIG. 3 is a photograph illustrating states of carbon nanotube aqueous dispersions 1 to 12 after being dried overnight.

Preferred embodiments of the invention are described in detail below with reference to the drawings. The embodiments described below do not unduly limit the scope of the invention as stated in the claims. In addition, all of the components described below should not necessarily be taken as essential elements of the invention.

1. Method of Producing Carbon Nanotube Aqueous Dispersion

First, a method of producing a carbon nanotube aqueous dispersion according to an embodiment of the invention is described with reference to the drawings. FIG. 1 is a flowchart illustrating the method of producing a carbon nanotube aqueous dispersion according to this embodiment.

As illustrated in FIG. 1, the method of producing a carbon nanotube dispersion according to this embodiment includes: a mixed liquid preparation step (step S1) of preparing a mixed liquid by mixing carbon nanotubes (hereinafter sometimes referred to as "CNTs"), sodium carboxymethyl cellulose (hereinafter sometimes referred to as "CMC"), and water; and a CNT dispersion step (step S2) of dispersing the CNTs contained in the mixed liquid by an aqueous counter collision method. Now, each step of the method of producing a CNT aqueous dispersion according to this embodiment is described in sequence.

1.1. Mixed Liquid Preparation Step (Step S1)

1.1.1. Carbon Nanotube (CNT)

Examples of the CNT used in the mixed liquid preparation step include: a single-walled carbon nanotube (SWNT) in which one six-membered ring network (graphene sheet) made of carbon is wound into a cylindrical shape; and a multi-walled carbon nanotube (MWNT) in which a plurality of graphene sheets are wound into a concentrical shape. In the mixed liquid preparation step, only one or both of the SWNT and the MWNT may be used, but it is preferred to use only the MWNT as the CNT in consideration of the dispersibility of the CNTs.

The above-mentioned CNT is produced in a preferred size, for example, by an arc discharge method, a laser ablation method, a chemical vapor deposition (CVD) method, or the like. The CNT used in the mixed liquid preparation step may be produced by any of the methods.

The diameter of the CNT is not particularly limited, but is preferably 1 nm or more and 100 nm or less, more preferably 5 nm or more and 50 nm or less, still more preferably 8 nm or more and 15 nm or less. When the diameter of the CNT falls within the above-mentioned ranges, a CNT aqueous dispersion having satisfactory dispersibility can be produced. The diameter of the CNT may be measured with a scanning electron microscope (SEM).

The fiber length of the CNT is not particularly limited, but is preferably 0.5 μm or more and 50 μm or less, more preferably 15 μm or more and 35 μm or less. When the fiber length of the CNT falls within the above-mentioned ranges, a CNT aqueous dispersion having satisfactory dispersibility can be produced. The fiber length of the CNT may be measured with the SEM. The "fiber length of the CNT" is the length in a state in which the CNTs are tied in bunch (bundled) with a van der Waals' force, and is the length of the CNT before being dispersed in a solvent.

The BET specific surface area of the CNT is not particularly limited, but is preferably 50 $m^2/g$ or more and 500 $m^2/g$ or less, more preferably 100 $m^2/g$ or more and 300 $m^2/g$ or less. When the BET specific surface area of the CNT falls within the above-mentioned ranges, a CNT aqueous dispersion having satisfactory dispersibility can be produced. The "BET specific surface area" is a specific surface area measured by a Brunauer Emmett Teller (BET) method, and may be measured with an automatic specific surface area measuring device.

The content of the CNTs in the mixed liquid is not particularly limited, but is preferably 0.1 mass % or more and 10.0 mass % or less, more preferably 0.5 mass % or more and 5.0 mass % or less, still more preferably 1.0 mass % or more and 3.0 mass % or less. When the content of the CNTs is 0.1 mass % or more, an electromagnetic wave shielding sheet having a high shielding property (electromagnetic wave shielding property) against an electromagnetic wave can be manufactured. Further, when the content of the CNTs is 5.0 mass % or less, a CNT aqueous dispersion having satisfactory dispersibility can be produced.

1.1.2. Sodium Carboxymethyl Cellulose (CMC)

In the mixed liquid preparation step, the CMC is used as a dispersant. Herein, the "dispersant" refers to an additive that disperses the CNTs in water, to thereby contribute to prevention of aggregation and sedimentation of the CNTs.

In the mixed liquid preparation step, only the CMC may be used as the dispersant. That is, the mixed liquid prepared in the mixed liquid preparation step may not contain an additive, other than the CMC, which contributes to prevention of aggregation and sedimentation of the CNTs. By using only the CMC as the dispersant, air bubbles can be prevented from being mixed as compared to the case in which, for example, an anionic surfactant or the like is added as the dispersant in addition to the CMC, and hence a mixed liquid can be easily prepared. The mixed liquid may contain an additive other than the dispersant. Such additive is, for example, a thickener as described later.

The molecular weight of the CMC is not particularly limited, but is preferably 5,000 or more and 100,000 or less, more preferably 10,000 or more and 60,000 or less, still more preferably 10,000 or more and 35,000 or less. When the molecular weight of the CMC is 5,000 or more, the CMC is easily entangled with the CNT, and the dispersibility of the CNTs is improved. However, when the molecular weight is too large, the dispersibility deteriorates conversely, and hence the molecular weight of the CMC is preferably 100,000 or less.

The degree of etherification of the CMC is not particularly limited, but is preferably 0.6 or more and 1.2 or less, more preferably 0.6 or more and 0.8 or less. When the degree of etherification of the CMC falls within the above-mentioned ranges, a CNT aqueous dispersion having satisfactory dispersibility can be produced.

In the mixed liquid, the content of the CMC is not particularly limited, but is preferably 0.1 mass % or more and 10.0 mass % or less, more preferably 0.5 mass % or more and 5.0 mass % or less, still more preferably 1.0 mass % or more and 3.0 mass % or less.

In the mixed liquid, a ratio $M_{CMC}/M_{CNT}$ of a mass $M_{CMC}$ of the CMC to a mass $M_{CNT}$ of the CNTs is 1/7 or more, preferably 1/6 or more. When the ratio $M_{CMC}/M_{CNT}$ is 1/7 or more, a CNT aqueous dispersion having satisfactory dispersibility can be produced (see "3. Experimental Example" described later for details).

In the mixed liquid, the ratio $M_{CMC}/M_{CNT}$ is preferably 9 or less, more preferably 6 or less, still more preferably 3 or less. When the ratio $M_{CMC}/M_{CNT}$ is 9 or less, a CNT aqueous dispersion having satisfactory dispersibility can be produced. By using a CNT aqueous dispersion having a ratio $M_{CMC}/M_{CNT}$ of 3 or less, preferably 1 or less, an electromagnetic wave shielding sheet having a high electromagnetic wave shielding property can be produced (see "3. Experimental Example" described later for details).

1.1.3. Water

In the mixed liquid preparation step, water is used as a solvent. Examples of the water include pure water, such as ion-exchanged water, ultra-filtered water, reverse osmosis water, or distilled water, and ultrapure water in which ionic impurities are removed to the extent possible. By using water as a solvent, an environment-friendly mixed liquid as compared to the case in which an organic solvent is used as a solvent can be prepared. In the mixed liquid preparation step, the mixed liquid may be prepared by mixing only CNTs, CMC, and water. That is, the mixed liquid may contain only CNTs, CMC, and water.

1.1.4. Thickener

In the mixed liquid preparation step, the mixed liquid may be prepared by further mixing a thickener. That is, the mixed liquid may contain CNTs, CMC, water, and a thickener. When the mixed liquid contains a thickener, the viscosity of the CNT aqueous dispersion can be adjusted. Because of this, an electromagnetic wave shielding sheet can be easily manufactured by using the CNT aqueous dispersion according to this embodiment. The electromagnetic wave shielding sheet is manufactured, for example, by a method involving causing the CNT aqueous dispersion to adhere to a roller with the use of a roll coater and transferring the CNT aqueous dispersion to a base material, such as paper, with the roller. When the viscosity of the CNT aqueous dispersion is low, it becomes difficult to cause the CNT aqueous dispersion to adhere to the roller. Accordingly, the adhesive property of the CNT aqueous dispersion to the roller is improved by adding the thickener to the mixed liquid. Thus, an electromagnetic wave shielding sheet can be easily manufactured.

The method of manufacturing the electromagnetic wave shielding sheet is not limited to the method involving using the roll coater, and the electromagnetic wave shielding sheet may be manufactured by a method involving directly applying the CNT aqueous dispersion to a base material with, for example, a wire bar coater, a knife coater, an air knife coater, a blade coater, a reverse roll coater, or a die coater.

The viscosity of the mixed liquid is not particularly limited, but is preferably 100 mPa·s or more and 3,000 mPa·s or less at 20° C. When the viscosity of the mixed liquid is 100 mPa·s or more, the CNT aqueous dispersion is easily applied to the base material by using a roller as described above. Further, when the viscosity of the mixed liquid is 3,000 mPa·s or less, the mixed liquids are easily ejected from nozzle holes of a wet pulverization and dispersion device as described later. The viscosity of the CNT aqueous dispersion may be measured with a viscometer. When the mixed liquid contains a thickener, the mass of the thickener is, for example, 0.4% or less, preferably 0.1% or less, more preferably 100 ppm (0.01%) or less with respect to the mass of the mixed liquid.

Examples of the thickener used in the mixed liquid preparation step include: celluloses, such as methyl cellulose and hydroxypropyl cellulose, and ammonium salts or alkali metal salts thereof; polycarboxylic acids, such as poly(meth) acrylic acid and a modified poly(meth)acrylic acid, and alkali metal salts thereof; polyvinyl alcohol-based (co)polymers, such as polyvinyl alcohol, a modified polyvinyl alcohol, and an ethylene-vinyl alcohol copolymer; saponified products of copolymers of unsaturated carboxylic acids, such as (meth)acrylic acid, maleic acid, and fumaric acid, and vinyl esters; and water-soluble polymers, such as a polyacrylamide-based copolymer.

1.1.5. Other Additives

The mixed liquid prepared in the mixed liquid preparation step may further contain various additives such as a preservative and a pH adjuster, as required.

1.2. CNT Dispersion Step (Step S2)

In the CNT dispersion step, the CNTs contained in the mixed liquid are dispersed by the aqueous counter collision method. When the CNTs contained in the mixed liquid are dispersed by the aqueous counter collision method, the CNTs can be dispersed with satisfactory dispersibility even when the mixed liquid contains only the CMC as a dispersant. Because of this, a CNT aqueous dispersion having satisfactory dispersibility can be produced.

As used herein, the "aqueous counter collision method" refers to a method involving ejecting mixed liquids containing CNTs at high pressure from a pair of nozzle holes (first nozzle hole and second nozzle hole) arranged so as to be opposed to each other and causing the mixed liquid ejected from the first nozzle hole and the mixed liquid ejected from the second nozzle hole to collide with each other to disperse the CNTs. In the aqueous counter collision method, it is preferred that the CNTs contained in the mixed liquid ejected from the first nozzle hole and the CNTs contained in the mixed liquid ejected from the second nozzle hole be caused to collide with each other to disperse the CNTs. In the aqueous counter collision method, when the central axis of the first nozzle hole and the central axis of the second nozzle hole intersect with each other, both the central axes may be on a straight line or may be inclined to each other.

In the aqueous counter collision method in the CNT dispersion step, the mixed liquids are ejected from nozzle holes each having a diameter of preferably 50 μm or more and 200 μm or less, more preferably 80 μm or more and 120 μm or less, still more preferably 100 μm and the mixed liquids are caused to collide with each other. When the diameter of the nozzle hole is 50 μm or more, even a mixed liquid having a high viscosity can be ejected from the nozzle hole. Further, when the diameter of the nozzle hole is 200 μm or less, the collision energy between the CNTs contained in the mixed liquid can be increased.

In the aqueous counter collision method in the CNT dispersion step, the mixed liquids are ejected at a pressure of preferably 150 MPa or more and 250 MPa or less, more preferably 180 MPa or more and 220 MPa or less, still more preferably 200 MPa, and the mixed liquids are caused to collide with each other. When the pressure is 150 MPa or more, the collision energy between the CNTs contained in the mixed liquid can be increased. Further, when the pressure is 250 MPa or less, it is possible to suppress the situation in which the collision energy becomes too high, and the fibers of the CNTs are broken, with the result that the viscosity of a CNT aqueous dispersion is decreased.

Specifically, the aqueous counter collision method in the CNT dispersion step is performed by using a wet pulverization and dispersion device "Star Burst Labo" (model name: HJP-25005) manufactured by Sugino Machine Limited. The wet pulverization and dispersion device has a high energy density as compared to, for example, an ultrasonic homogenizer or a ball mill and can produce a CNT aqueous dispersion having satisfactory dispersibility in a short period of time. Further, the wet pulverization and dispersion device can minimize the mixing of impurities, and can produce a CNT aqueous dispersion having extremely little mixing of impurities.

The number of passes of the mixed liquid in the wet pulverization and dispersion device is preferably 1 time or more and 40 times or less, more preferably 2 times or more and 10 times or less, still more preferably 2 times or 3 times. When the number of passes is 40 times or less, it is possible to suppress the situation in which the collision between the CNTs breaks the fibers of the CNTs to decrease the viscosity of the CNT aqueous dispersion. In addition, when the number of passes is 2 times or more, the CNTs can be homogeneously dispersed in the aqueous dispersion. Further, in the case where an electromagnetic wave shielding sheet is manufactured by using the CNT aqueous dispersion according to this embodiment, when the number of passes is 2 times or more, no significant difference is recognized in shielding property against an electromagnetic wave (see "3. Experimental Example" described later for details). Accordingly, when the number of passes is 2 times or more and 10 times or less, the treatment time with the wet pulverization and dispersion device can be shortened while the dispersibility and the electromagnetic wave shielding property are kept.

Herein, the "number of passes of the mixed liquid in the wet pulverization and dispersion device" refers to the number of circulations of the mixed liquid in the wet pulverization and dispersion device, and for example, the phrase "number of passes is 2 times" means that the mixed liquid is circulated twice so that the CNTs which have collided once collide again. As described above, the number of passes corresponds to the number of collisions of the CNTs contained in the mixed liquid. Further, the number of passes is proportional to the treatment time in the wet pulverization and dispersion device. When the treatment time in the wet pulverization and dispersion device is long, the number of circulations of the mixed liquid is increased.

The device used in the aqueous counter collision method in the CNT dispersion step is not limited to the above-mentioned wet pulverization and dispersion device "Star Burst Labo" as long as the device can produce a CNT aqueous dispersion having satisfactory dispersibility.

Further, it is preferred to treat the mixed liquid with a homogenizer as pretreatment before performing the CNT dispersion step. The homogenizer may be an ultrasonic type that causes cavitation with an ultrasonic wave, a stirring type that stirs the mixed liquid, or a pressure type that applies a pressure to the mixed liquid. Through the treatment with the homogenizer, aggregates formed by the CNTs can be reduced, and the CNT dispersion step can be smoothly performed.

2. Electromagnetic Wave Shielding Sheet

Next, an electromagnetic wave shielding sheet according to an embodiment of the invention is described. An electromagnetic wave shielding sheet can be produced by drying the CNT aqueous dispersion produced in the above-mentioned "1. Method of Producing CNT Aqueous Dispersion" to evaporate the moisture of the CNT aqueous dispersion. A method of drying the CNT aqueous dispersion is not particularly limited. The CNT aqueous dispersion may be dried with a heat plate, a heater, or the like, or may be naturally dried.

The electromagnetic wave shielding sheet according to this embodiment may be obtained by putting the CNT aqueous dispersion in a petri dish or the like and then drying the CNT aqueous dispersion.

Alternatively, the electromagnetic wave shielding sheet according to this embodiment may be obtained by applying the CNT aqueous dispersion to a base material, such as paper, and drying the applied CNT aqueous dispersion. A method of applying the CNT aqueous dispersion to the base material is not particularly limited, but for example, there are given a method involving directly applying the CNT aqueous dispersion to the base material by using a wire bar coater, a knife coater, an air coater, a blade coater, a reverse roll coater, a die coater, or the like, a method involving causing the CNT aqueous dispersion to adhere to a roller and transferring the CNT aqueous dispersion adhering to the roller to the base material, such as a so-called roll coater, and the like.

The electromagnetic wave shielding sheet according to this embodiment has a shape in which the size in a direction orthogonal to a thickness direction is sufficiently large with respect to the thickness. The shape of the electromagnetic wave shielding sheet is not particularly limited when viewed from the thickness direction, but is, for example, a circle, an ellipse, or a polygon, such as a quadrangle.

The thickness of the electromagnetic wave shielding sheet according to this embodiment is not particularly limited, but is preferably 0.1 μm or more and 500 μm or less, more preferably 1 μm or more and 300 μm or less, still more preferably 30 μm or more and 160 μm or less. The thickness of the electromagnetic wave shielding sheet may be measured with the SEM.

When the thickness of the electromagnetic wave shielding sheet is 0.1 μm or more, the electromagnetic wave shielding property of the electromagnetic wave shielding sheet can be increased. Further, when the thickness of the electromagnetic wave shielding sheet is 500 μm or less, the occurrence of cracks in the electromagnetic wave shielding sheet can be suppressed.

In addition, when the thickness of the electromagnetic wave shielding sheet is 30 μm or more, the transmission loss of the electromagnetic wave shielding sheet can be reduced to −30 dB or less (see "3. Experimental Example" described later for details), and the electromagnetic wave shielding property can be significantly increased. Further, when the thickness of the electromagnetic wave shielding sheet is 160 μm or less, the amount of the CNTs can be reduced while the electromagnetic wave shielding property is kept. When the electromagnetic wave shielding sheet becomes thicker (the amount of the CNTs becomes larger), the electromagnetic wave shielding property is increased. However, when the thickness is more than 160 μm the transmission loss tends to be saturated (see FIG. 13 described later for details). The CNTs are more expensive than other carbon materials, such as carbon black, and hence the cost can be reduced by setting the thickness to 160 μm or less to reduce the amount of the CNTs.

The electromagnetic wave shielding sheet according to this embodiment is not particularly limited, but has, for example, a high shielding property against a frequency of 10 MHz or more and 100 GHz or less. The shielding property of the electromagnetic wave shielding sheet is evaluated by, for example, a coaxial tube method, a free space method, a microstrip line method, a Kansai Electronic Industry Development Center (KEC) method, or the like.

3. Experimental Examples

Now, the invention is described more specifically by way of experimental examples. The invention is not limited to the following experimental examples.

3.1. Evaluation of Dispersibility of CNTs 3.1.1. Preparation of CNT Aqueous Dispersion
(1) CNT Aqueous Dispersions 1 to 10

CNTs, CMC, and water were mixed to prepare a mixed liquid. As the CNTs, "K-Nanos-100P" manufactured by Kumho Petrochemical Co., Ltd. was used. The CNTs are MWNTs, each having a diameter of from 8 nm to 15 nm, a fiber length of 27 μm (bundle), and a BET specific surface area of 220 m²/g. As the CMC, "Cellogen 5A" manufactured by DKS Co. Ltd. was used. The CMC has a molecular weight of from 11,000 to 15,000, and a degree of etherification of 0.7. The total of the CNT content and the CMC content of the mixed liquid was set to 5 mass %. The ratio of the mass of the CMC to the mass of the CNTs was changed to from 1/9 to 9 (CNT:CMC=1:9 to 9:1). Only the CMC was used as a dispersant. No additives, such as a thickener, were added.

Next, the above-mentioned mixed liquid was treated with a homogenizer "Biomixer BM-2" manufactured by NISSEI Corporation. The treatment time was set to 5 minutes.

Next, the aqueous counter collision method was performed on the above-mentioned mixed liquid. The aqueous counter collision method was performed by using a wet pulverization and dispersion device "Star Burst Labo" (model name: HJP-25005) manufactured by Sugino Machine Limited. The diameter of each nozzle hole from which the mixed liquid was ejected was set to 100 μm and the ejection pressure of the mixed liquid was set to 200 MPa. The number of passes of the mixed liquid with the wet pulverization and dispersion device was set to 2 times.

In this manner, CNT aqueous dispersions 1 to 10 having different ratios between the CNTs and the CMC were prepared. The "CNT aqueous dispersion" is hereinafter sometimes simply referred to as "dispersion". FIG. 2 is a table illustrating preparation conditions of the dispersions 1 to 10 and the dispersions 11 and 12 described later.

(2) CNT Aqueous Dispersion 11

The dispersion 11 was prepared in the same manner as in the above-mentioned dispersion 1 except that the CMC was not mixed when the mixed liquid was prepared.

(3) CNT Aqueous Dispersion 12

The dispersion 12 was prepared in the same manner as in the above-mentioned dispersion 4 except that the aqueous counter collision method was not performed on the mixed liquid.

3.1.2. Evaluation Method

The dispersions 1 to 12 prepared as described above were each put in a petri dish having a diameter of 8.5 cm and dried at 50° C. for 12 hours to evaporate moisture. Then, the dispersibility of the CNTs was evaluated by observing the film-forming property of the dried product. When the dispersibility of the CNTs is more satisfactory, a film having satisfactory uniformity is formed. The specific evaluation criteria are described below.

A: A crack-free film was formed on an entire surface of the petri dish.

B: A film was formed on the entire surface of the petri dish, but cracks occurred.

C: No film was formed.

3.1.3. Evaluation Results

FIG. 2 illustrates the evaluation results of the dispersibility of the dispersions 1 to 12. In addition, FIG. 3 is a photograph illustrating a state of each of the dispersions 1 to 12 after being put in the petri dish and dried at 50° C. for 12 hours.

As illustrated in FIG. 2 and FIG. 3, the dispersions 1 to 8 had satisfactory film-forming properties and satisfactory dispersibility of the CNTs as compared to those of the dispersions 9 to 12.

In the dispersions 1 to 7, no significant difference in film-forming property was recognized, and a crack-free film was formed. In the dispersion 8, the content of the CMC with respect to the CNTs was small, and hence cracks occurred in the film. In the dispersions 9 and 10, the content of the CMC with respect to the CNTs was too small, and hence no film was formed. It was found from this evaluation that a CNT aqueous dispersion having satisfactory dispersibility can be produced by setting a ratio $M_{CMC}/M_{CNT}$ of a mass $M_{CMC}$ of the CMC to a mass $M_{CNT}$ of the CNTs to 1/7 or more, preferably 1/6 or more.

In the dispersion 11, the CMC was not added to the mixed liquid, and hence the dispersibility of the CNTs was poor, with the result that no film was formed in the same manner as in the dispersions 9 and 10.

In the dispersion 12, the aqueous counter collision method was not performed on the mixed liquid, and hence the dispersibility of the CNTs was poor, with the result that no film was formed. It was found that a CNT aqueous dispersion having satisfactory dispersibility can be produced by dispersing the CNTs by the aqueous counter collision method.

3.2 Evaluation of Electromagnetic Wave Shielding Property 3.2.1. Preparation of Coated Paper and Dry Film The above-mentioned dispersions 1 to 10 were each applied to paper ("μ Coat Neos" (trademark) manufactured by Hokuetsu Corporation having a basis weight of 157 g/m²) by using a roll coater. Then, the resultant was dried at 120° C. for 3 minutes to evaporate moisture, to thereby produce coated paper. That is, the "coated paper" is paper having a CNT-containing sheet containing CNTs applied thereto.

Further, the dispersions 1 to 8 were each dried in the same manner as in the above-mentioned "3.1.2. Evaluation Method" to produce a dry film. That is, the "dry film" is a CNT-containing sheet that is not applied to a base material, such as paper. In the dispersions 9 and 10, no film was formed as described above, and hence no dry film was able to be produced.

3.2.2. Evaluation Method

In the coaxial tube method, an electromagnetic wave shielding property was evaluated by measuring "S21". The "S21" corresponds to a transmission loss. When the absolute value of the "S21" is larger, the electromagnetic wave shielding property is higher. As a testing machine, a network analyzer "ZVA67" manufactured by ROHDE & SCHWARZ and shield effect measurement kits "S-39D" and "S-GPC7" manufactured by KEYCOM Corporation were used. The evaluation was performed under the condition that the measurement frequency was divided into a range of from 45 MHz to 3 GHz and a range of from 500 MHz to 18 GHz.

Figure 7:
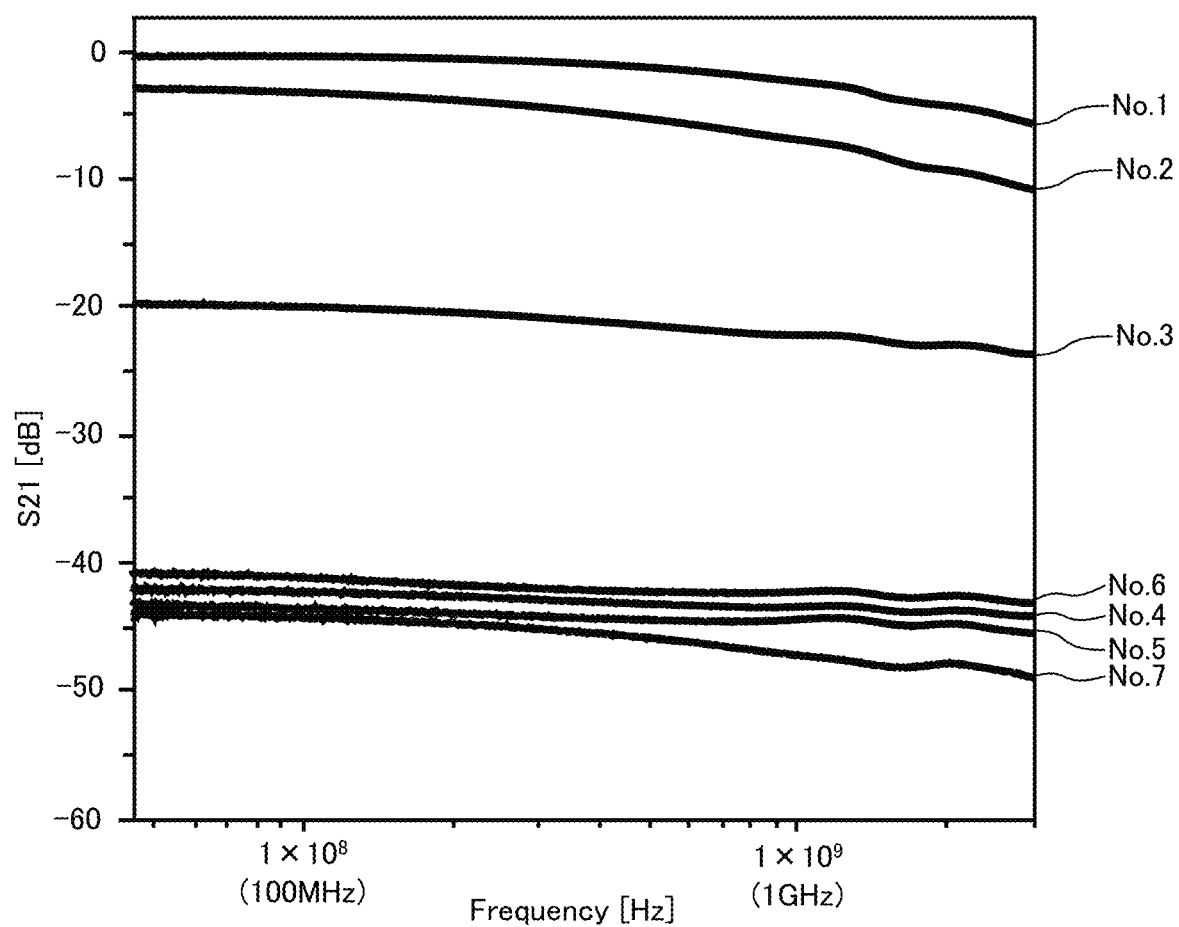
FIG. 7 is a graph illustrating S21 with respect to a frequency in a dry film.
Figure 8:
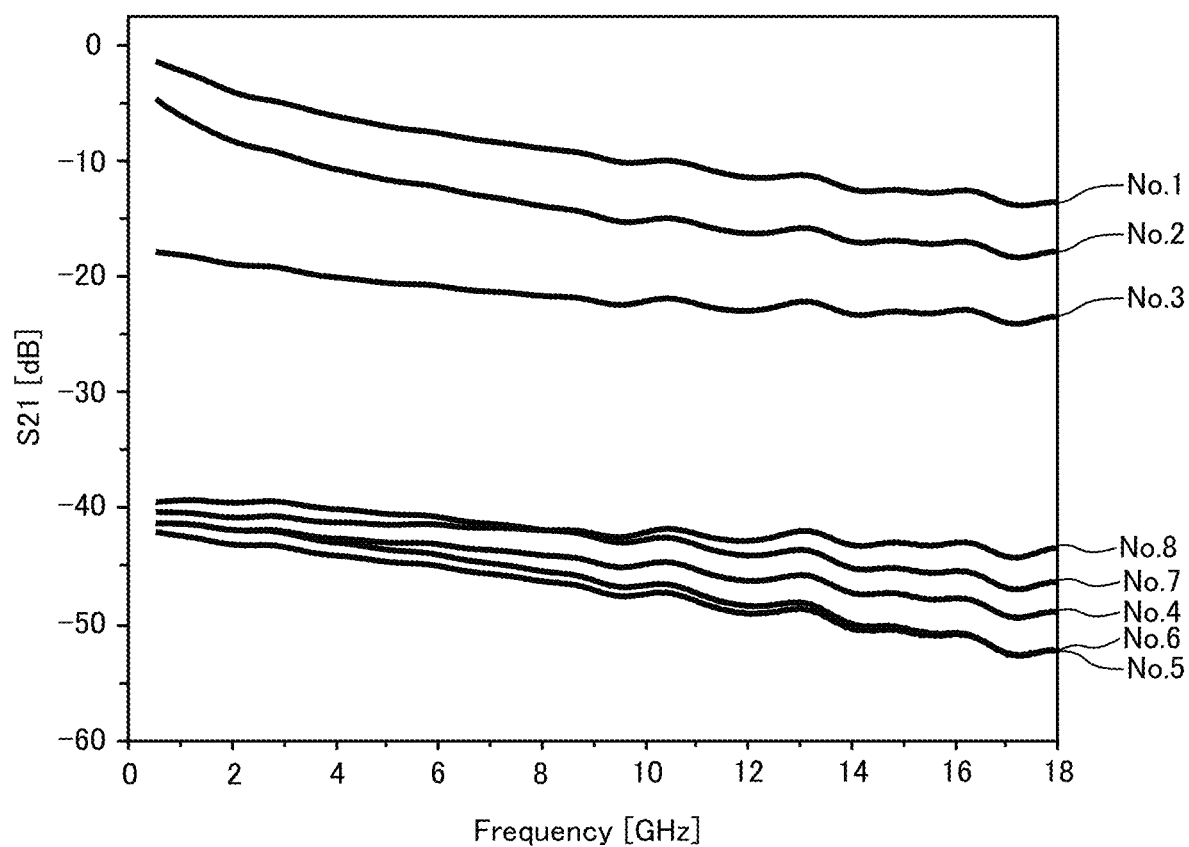
FIG. 8 is a graph illustrating S21 with respect to a frequency in a dry film.
Figure 9:
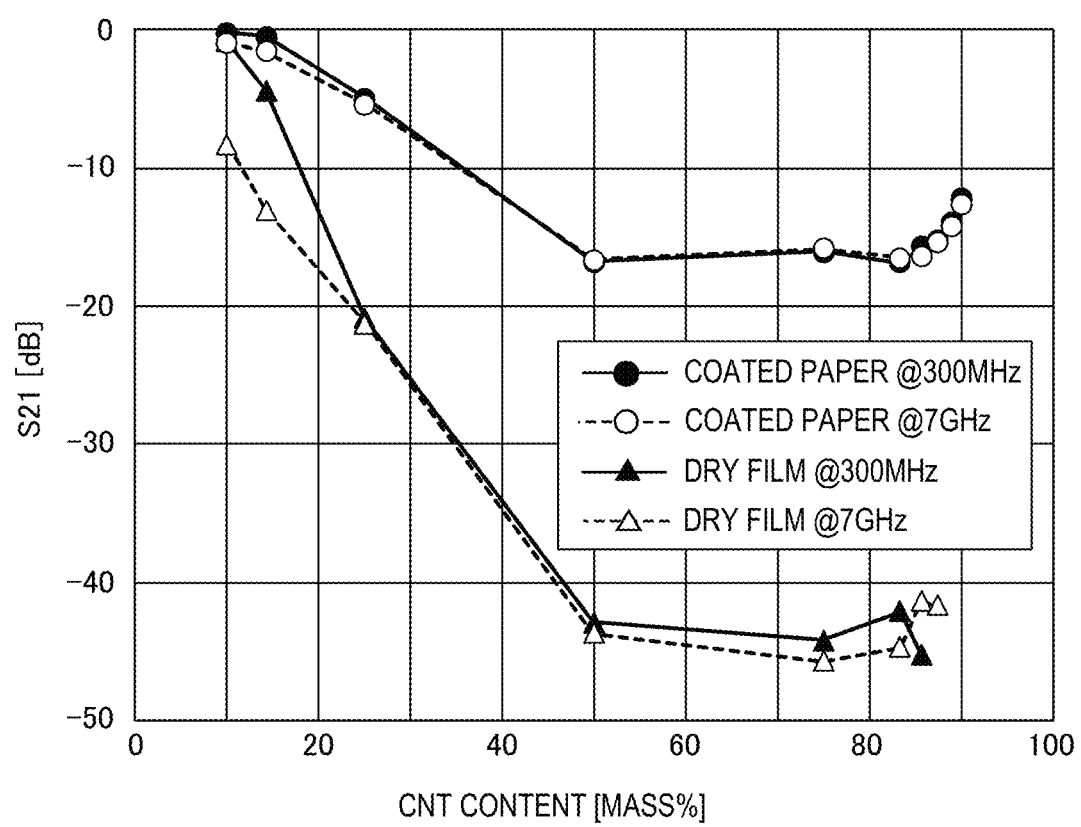
FIG. 9 is a graph illustrating S21 with respect to a carbon nanotube content.

3.2.3. Evaluation Results (1) Evaluation Results when Ratio between CNTs and CMC is Changed The electromagnetic wave shielding property of each of the coated paper and the dry film produced as described above was evaluated. FIG. 4 is a table illustrating the evaluation results of the electromagnetic wave shielding property of each of the coated paper and the dry film. FIG. 5 to FIG. 8 are each a graph illustrating "S21" with respect to a frequency, and the "S21" illustrated in FIG. 4 is obtained by extracting values at 300 MHz and 7 GHz from FIG. 5 to FIG. 8. FIG. 9 is a graph obtained by plotting "S21" with respect to a "CNT content" illustrated in FIG. 4.

Figure 5:
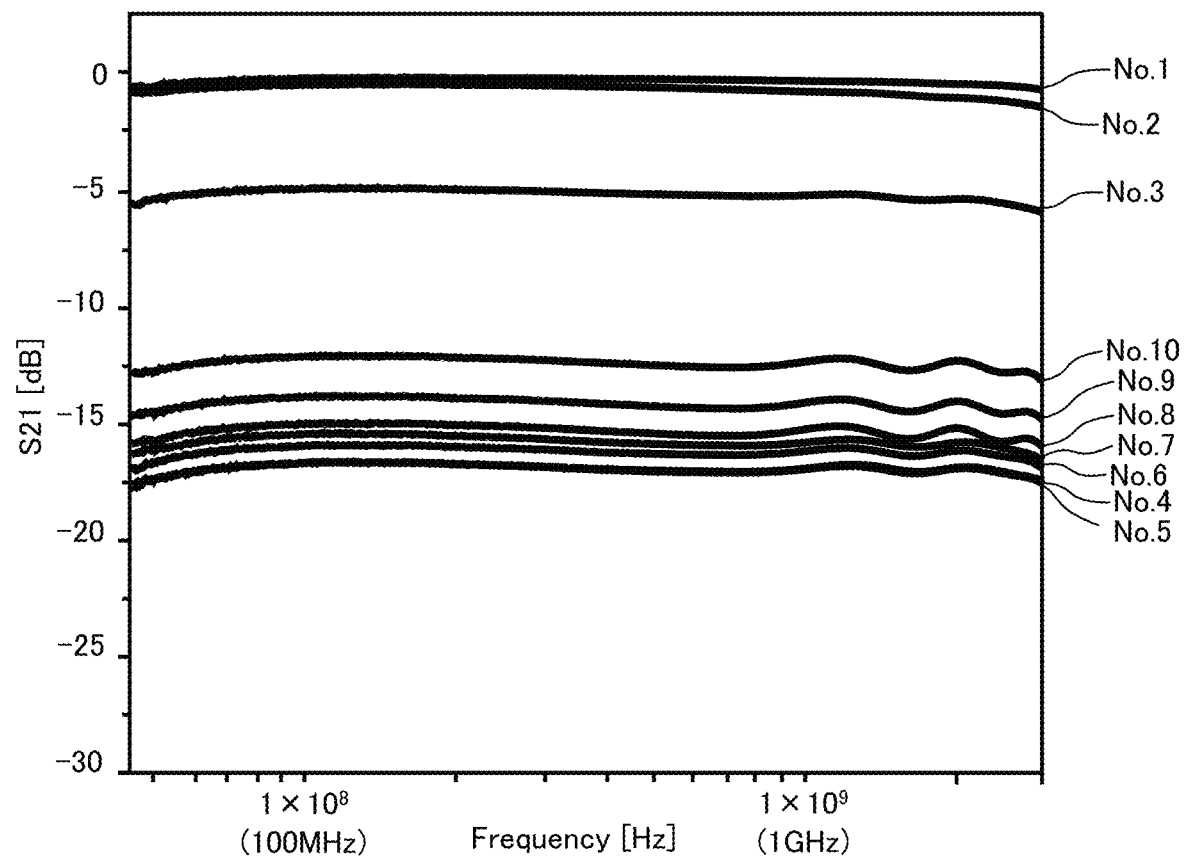
FIG. 5 is a graph illustrating S21 with respect to a frequency in coated paper.
Figure 6:
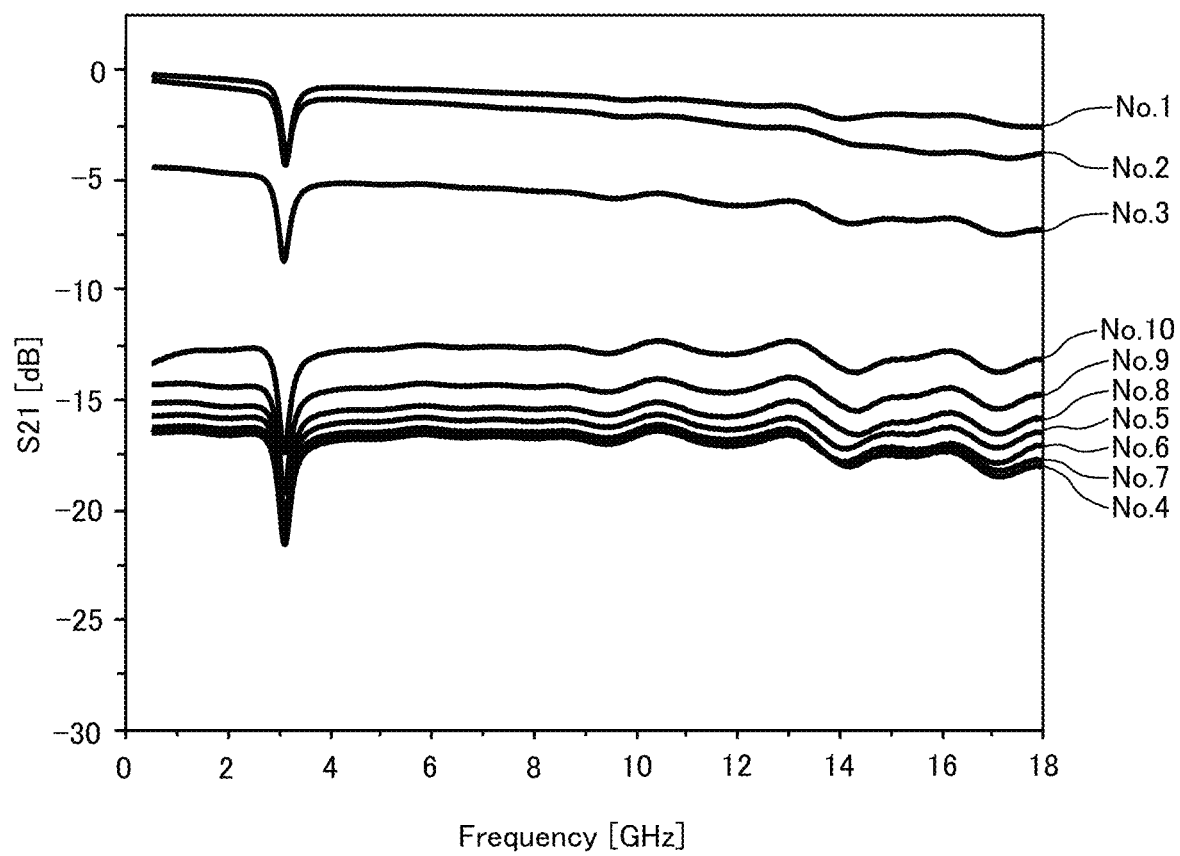
FIG. 6 is a graph illustrating S21 with respect to a frequency in coated paper.

FIG. 5 and FIG. 6 are each a graph illustrating "S21" of the coated paper. The measurement frequency of FIG. 5 is from 45 MHz to 3 GHz, and the measurement frequency of FIG. 6 is from 500 MHz to 18 GHz. FIG. 7 and FIG. 8 are each a graph illustrating "S21" of the dry film. The measurement frequency of FIG. 7 is from 45 MHz to 3 GHz, and the measurement frequency of FIG. 8 is from 500 MHz to 18 GHz.

In addition, the "CNT content" is illustrated in FIG. 4. The "CNT content" is a content ratio (mass %) of CNTs when the total of the mass of the CNTs and the mass of the CMC is set to 100 mass %.

In addition, the thickness of each of the coated paper and the dry film is illustrated in FIG. 4. The thickness of each of the coated paper and the dry film was measured with the SEM. In FIG. 4, the thickness of the coated paper indicates the thickness of only the CNT-containing sheet (thickness not including the paper). This similarly applies to FIG. 10, FIG. 13, and FIG. 14 described later.

As illustrated in FIG. 4 to FIG. 9, in the coated paper and the dry film (hereinafter sometimes referred to as "coated paper" and the like) produced from the dispersions 1 to 4, when the CNT content was larger, the absolute value of the "S21" was increased. In the coated paper and the like produced from the dispersions 4 to 7, the "S21" remained substantially at the same level. In the coated paper and the like produced from the CNT aqueous dispersions 8 to 10, the absolute value of the "S21" was smaller than those in the coated paper and the like produced from the dispersions 4 to 7. This is presumably because the dispersions 8 to 10 had poor dispersibility as described above, and hence the electromagnetic wave shielding property was decreased.

It was found from the above-mentioned evaluation that the electromagnetic wave shielding property can be increased by setting the ratio of the mass of the CMC to the mass of the CNTs to 1/6 or more and 3 or less (CNT:CMC=1:3 to 6:1), preferably 1/6 or more and 1 or less (CNT:CMC=1:1 to 6:1).

In the coated paper and the dry film, the dry film was thicker, and hence the electromagnetic wave shielding property thereof became high.

(2) Evaluation Results when Number of Passes is Changed

In the above-mentioned dispersion 4 (CNT:CMC=1:1), the number of passes was changed by changing the treatment time of the mixed liquid with the wet pulverization and dispersion device, and thus coated paper was produced in the same manner as in the above-mentioned "(1) Evaluation when Ratio between CNTs and CMC is Changed". Then, the electromagnetic wave shielding property of the coated paper was evaluated. The amount of the mixed liquid was adjusted so that the treatment time of 0.5 minute of the mixed liquid with the wet pulverization and dispersion device corresponded to the number of passes of 1. Further, coated paper was produced from the above-mentioned dispersion 12 (dispersion not treated with the wet pulverization and dispersion device) and evaluated in the same manner. The coated paper was able to make the CNT-containing sheet thinner as compared to the dry film, and hence evaluation was able to be performed even with the dispersion 12 having poor dispersibility.

Figures 10, 11:
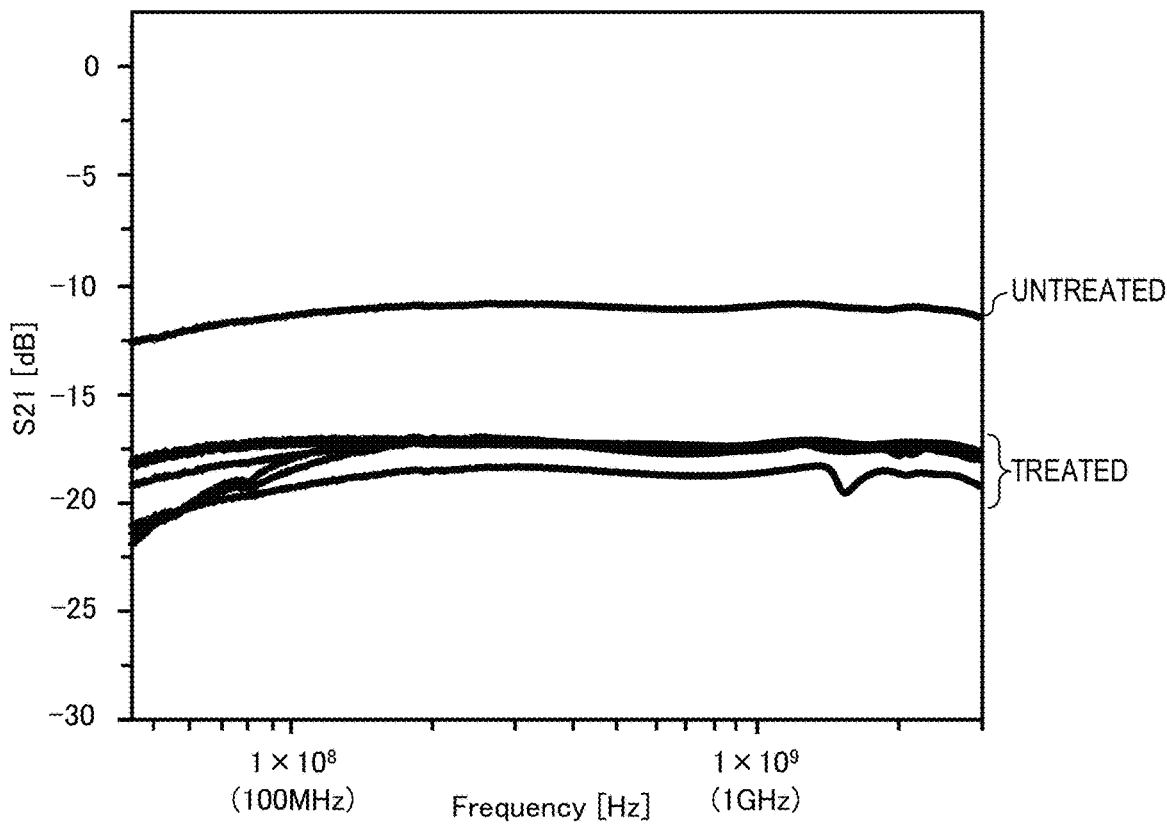
FIG. 10 is a table illustrating evaluation results of an electromagnetic wave shielding property when the number of passes is changed.
FIG. 11 is a graph illustrating S21 with respect to a frequency.
Figure 12:
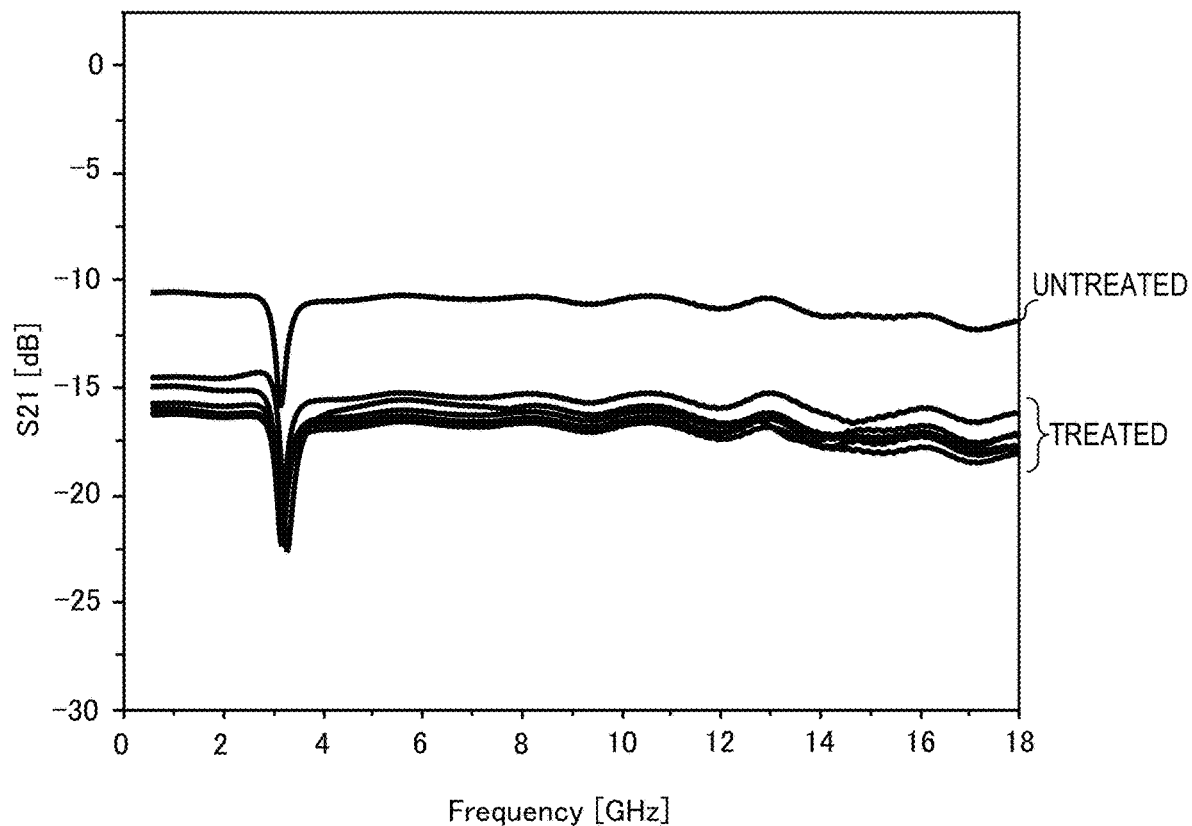
FIG. 12 is a graph illustrating S21 with respect to a frequency.

FIG. 10 is a table illustrating the evaluation results of the electromagnetic wave shielding property when the number of passes is changed. FIG. 11 and FIG. 12 are each a graph illustrating "S21" with respect to a frequency, and the "S21" illustrated in FIG. 10 is obtained by extracting values at 300 MHz and 7 GHz from FIG. 11 and FIG. 12, respectively. The measurement frequency of FIG. 11 is from 45 MHz to 3 GHz, and the measurement frequency of FIG. 12 is from 500 MHz to 18 GHz.

As illustrated in FIG. 10 to FIG. 12, the coated paper treated with the wet pulverization and dispersion device had a high electromagnetic wave shielding property as compared to the untreated coated paper. As illustrated in FIG. 10, the untreated coated paper had a low electromagnetic wave shielding property despite the large thickness.

It was found from the above-mentioned evaluation that the shielding property can be increased by performing the treatment with the wet pulverization and dispersion device, that is, the aqueous counter collision method. Regarding the coated paper treated with the wet pulverization and dispersion device, no significant difference was recognized in the electromagnetic wave shielding property.

(3) Evaluation Results when Thickness is Changed

In the above-mentioned dispersion 4 (CNT:CMC=1:1), coated paper and a dry film were produced in the same manner as in the above-mentioned "(1) Evaluation when Ratio between CNTs and CMC is Changed". The thickness of each of the coated paper and the dry film was changed by changing the amount of each of the CNTs and the CMC. Then, the electromagnetic wave shielding property of each of the coated paper and the dry film was evaluated.

Figure 13:
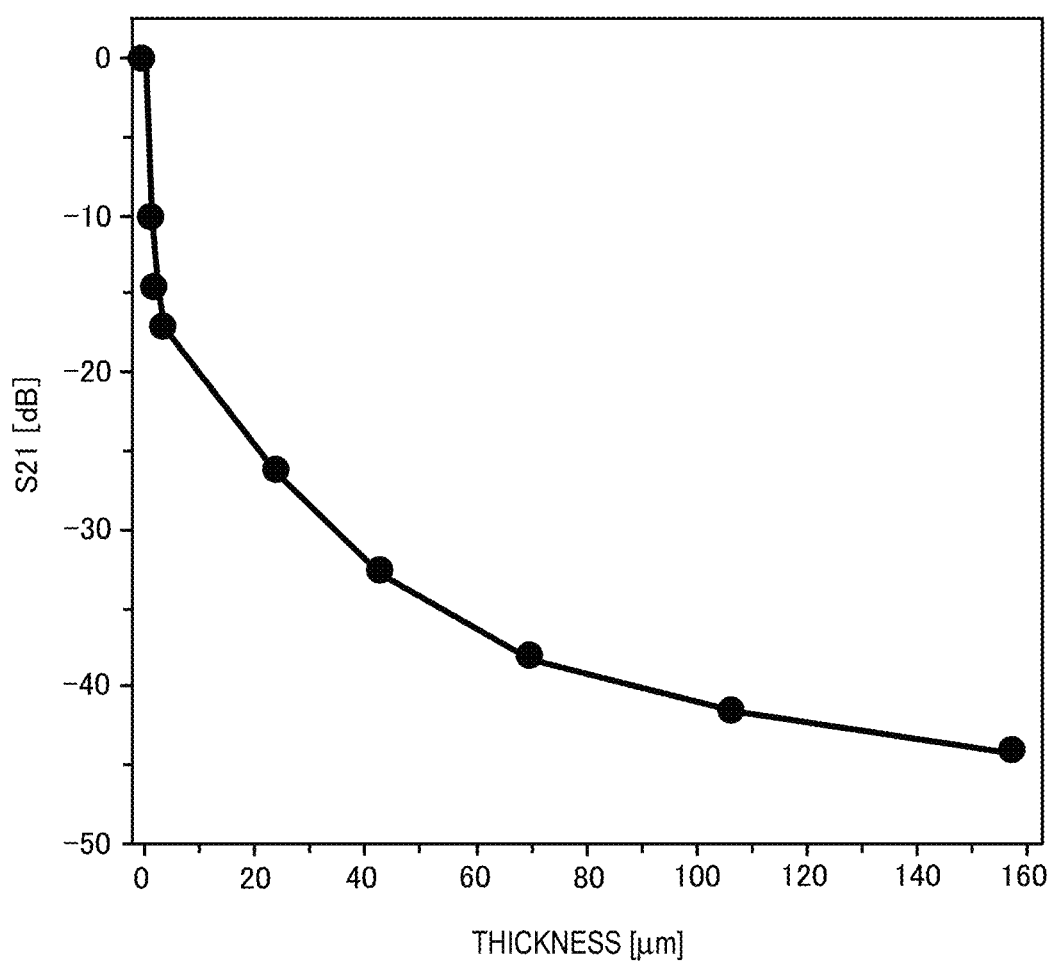
FIG. 13 is a graph illustrating S21 with respect to a thickness at a frequency of 300 MHz.
Figure 14:
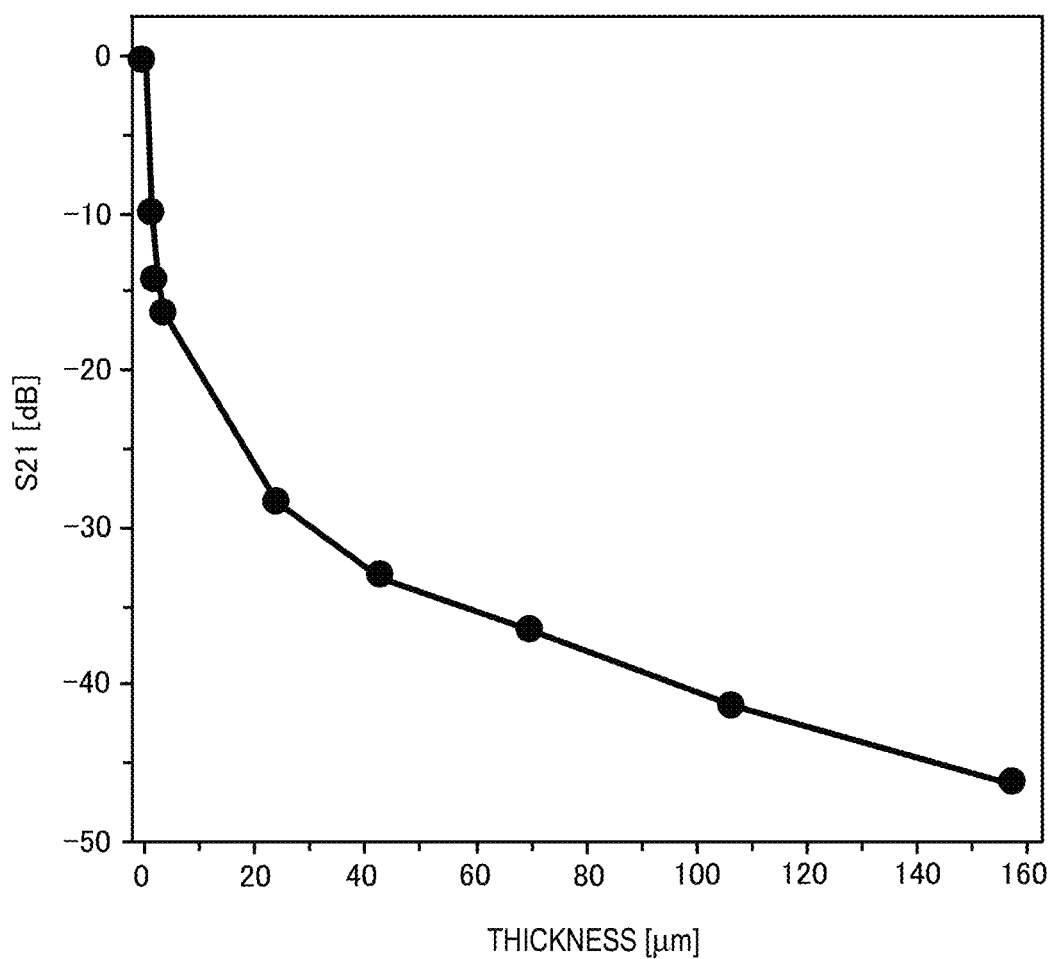
FIG. 14 is a graph illustrating S21 with respect to a thickness at a frequency of 7 GHz.

FIG. 13 and FIG. 14 are each a graph illustrating "S21" with respect to the thickness. The measurement frequency of FIG. 13 is 300 MHz, and the measurement frequency of FIG. 14 is 7 GHz. In FIG. 13 and FIG. 14, the thickness of 3.6 μm or less is obtained by plotting the thickness of the CNT-containing sheet of the coated paper (that is, the thickness obtained by subtracting the thickness of the paper from the total thickness), and the thickness of 24 μm or more is obtained by plotting the thickness of the dry film.

As illustrated in FIG. 13 and FIG. 14, it was found that, when the thickness becomes larger, the electromagnetic wave shielding property is increased. As illustrated in FIG. 13, it was found that the electromagnetic wave shielding property tends to be saturated particularly at a measurement frequency of 300 MHz when the thickness is 160 μm or more. It was found from the above-mentioned evaluation that the amount of the CNTs can be reduced while the transmission loss is kept at −30 dB or less by setting the thickness to 30 μm or more and 160 μm or less.

(4) Evaluation Results by Microstrip Line Method

The above-mentioned evaluation of the electromagnetic wave shielding property was performed by the coaxial tube method, but in this evaluation, the evaluation was performed by a microstrip line method. Coated paper (thickness of the CNT-containing layer: 0.34 μm and 4.5 μm) was produced from the dispersion 4 in the same manner as in the above-mentioned "(3) Evaluation when Thickness is Changed". Then, the electromagnetic wave shielding property of the coated paper was evaluated. Further, as a reference example, the electromagnetic wave shielding property of each of CNT-free paper ("μ Coat Neos" manufactured by Hokuetsu Corporation having a basis weight of 157 g/m$^2$) and aluminum foil (thickness: 6.5 μm) was evaluated.

As a testing machine, a network analyzer "8720ES" manufactured by Agilent Technologies, Inc. and a test fixture "TF-18C" manufactured by KEYCOM Corporation were used. The measurement frequency was set to from 50 MHz to 20 GHz.

Figure 15:
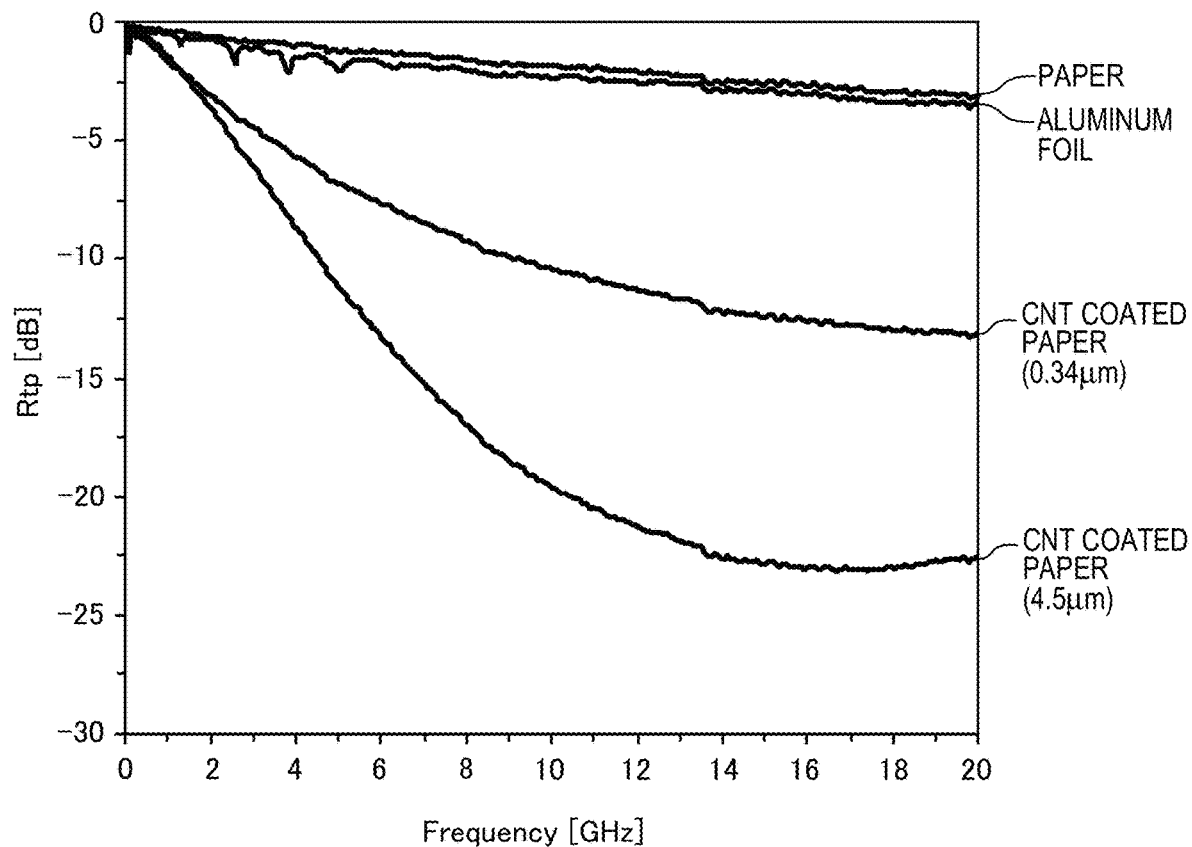
FIG. 15 is a graph illustrating S21 with respect to a frequency by a microstrip line method.

FIG. 15 is a graph illustrating the evaluation results of the electromagnetic wave shielding property by the microstrip line method. "Rtp" represented by the vertical axis in FIG. 15 indicates a transmission attenuation rate. When the absolute value is larger, the electromagnetic wave shielding property is higher.

As illustrated in FIG. 15, it was found that the coated paper containing CNTs has a higher electromagnetic wave shielding property than the paper and the aluminum foil. From the above-mentioned evaluation, the electromagnetic wave shielding property of the coated paper containing CNTs was able to be recognized even by the microstrip line method.

The invention is not limited to the above-described embodiments, and various modifications can be made. For example, the invention includes configurations that are substantially the same as the configurations described in the embodiments. Substantially same configurations mean configurations having the same functions, methods and results, or configurations having the same objectives and effects as those of the configurations described in the embodiments, for example. The invention also includes configurations obtained by replacing non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

The invention claimed is:

1. A method of producing a carbon nanotube aqueous dispersion, comprising:
   preparing mixed liquids by mixing carbon nanotubes, sodium carboxymethyl cellulose and water; and
   dispersing the carbon nanotubes contained in the mixed liquids by an aqueous counter collision method, wherein:
   a ratio of a mess of the sodium carboxymethyl cellulose to a mass of the carbon nanotubes in the mixed liquids is 1/7 or more and 3 or less, and
   the content of the carbon nanotubes in the mixed liquids is 1.25 mass % or more and 4.375 mass % or less.

2. The method of producing a carbon nanotube aqueous dispersion according to claim 1, wherein the aqueous counter collision method comprises ejecting the mixed liquids from nozzle holes each having a diameter of 50 µm or more and 200 µm or less at a pressure of 150 MPa or more and 250 MPa or less to cause the mixed liquids to collide with each other.

3. The method of producing a carbon nanotube aqueous dispersion according to claim 1, wherein the aqueous counter collision method is performed by using a wet pulverization and dispersion device.

4. The method of producing a carbon nanotube aqueous dispersion according to claim 3, wherein the number of passes of the mixed liquids in the wet pulverization and dispersion device is 2 times or more and 10 times or less.

5. The method of producing a carbon nanotube aqueous dispersion according to claim 1, wherein the step of preparing the mixed liquids comprises preparing the mixed liquids by further mixing a thickener.

6. The method of producing a carbon nanotube aqueous dispersion according to claim 1, wherein the step of preparing the mixed liquids comprises using only the sodium carboxymethyl cellulose as a dispersant.

* * * * *